(12) United States Patent
Chang et al.

(10) Patent No.: US 7,193,477 B2
(45) Date of Patent: Mar. 20, 2007

(54) CONCURRENT TRIPLE-BAND GAIN AMPLIFIER FOR MULTI-STANDARD COEXIST COMMUNICATIONS

(75) Inventors: Sheng-Fuh Chang, Hsinchu (TW); Wen-Lin Chen, Hsinchu (TW); Hung-Cheng Chen, Hsinchu (TW); Shu-Fen Tang, Hsinchu (TW); Albert Chen, Hsinchu (TW)

(73) Assignee: Integrated System Solution Corp. (TW)

( * ) Notice: Subject to any disclaimer, the term of this patent is extended or adjusted under 35 U.S.C. 154(b) by 43 days.

(21) Appl. No.: 11/147,458

(22) Filed: Jun. 8, 2005

(65) Prior Publication Data

US 2006/0279362 A1 Dec. 14, 2006

(51) Int. Cl.
*H03F 3/04* (2006.01)

(52) U.S. Cl. ..................................... 330/302; 330/306
(58) Field of Classification Search ................ 330/302, 330/305, 306; 333/175, 32
See application file for complete search history.

(56) References Cited

U.S. PATENT DOCUMENTS

| | | | | |
|---|---|---|---|---|
| 5,146,178 A | * | 9/1992 | Nojima et al. | 330/251 |
| 5,300,895 A | * | 4/1994 | Jones | 330/251 |
| 6,215,359 B1 | | 4/2001 | Peckham et al. | 330/302 |
| 6,252,461 B1 | * | 6/2001 | Raab | 330/302 |

OTHER PUBLICATIONS

Article entitled "Concurrent Multiband Low-Noise Amplifiers-Theory, Design, and Applications" by Hossein Hashemi et al., published in IEEE Transactions on Microwave Theory and Techniques, vol. 50, No. 1, Jan. 2002., pp. 288-301.

Article entitled "A 900-MHz/1.8-GHz CMOS Receiver for Dual-Band Applications" by Stephen Wu et al., published in IEEE Journal of Solid-State Circuits, vol. 33, No. 12, Dec. 1998, pp. 2178-2185.

Article entitled "A 2.7-V 900-MHz/1.9-GHz Dual-Band Transceiver IC for Digital Wireless Communication" by Joo Leong et al., published in IEEE Journal of Solid-State Circuits, vol. 34, No. 3, Mar. 1999, pp. 286-291.

Article entitled "A Dual-Band RF Front-End for WCDMA and GSM Applications" by Jussi Ryynanen et al., published in IEEE Journal of Solid-State Cicuits, vol. 36, No. 8, Aug. 2001, pp. 1198-1204.

Article entitled "A New Wide-Band Darlington Amplifier" by Armijo et al. published in the IEEE Journal of Solid State Circuits, vol. 24, No. 4, Aug. 1989, pp. 1105 through 1109.

* cited by examiner

*Primary Examiner*—Henry Choe
(74) *Attorney, Agent, or Firm*—Pillsbury Winthrop Shaw Pittman LLP

(57) ABSTRACT

The present invention discloses a gain amplifier, capable of concurrently operating at three different frequency bands. The gain amplifier comprises an amplification stage for amplifying a signal applied to an input of the amplifier and a triple-band resonance load connected between a DC bias voltage and a DC bias input of the amplification stage. The triple-band resonance load uses a set of reactive elements to provide match in a first frequency band, a second frequency band and in a third frequency band, such as at 2.4 GHz, 5.8 GHz and 9.0 GHz. According to the gain amplifier of the present invention, it can effectively provide triple-band signal amplification and in-band interference suppression for various multi-standard coexist communication systems.

23 Claims, 3 Drawing Sheets

AMPLIFICATION STAGE 10

| FREQUENCY | 2.4 GHz | 5.8 GHz | 8.4 to 9.5 GHz |
|---|---|---|---|
| POWER GAIN | >20.2 dB | >21.4 dB | >22.6 dB |
| INPUT RETURN LOSS | >16.7 dB | >24.3 dB | >11.3 dB |
| OUTPUT RETURN LOSS | >28.2 dB | >23 dB | >10.3 dB |
| OUTPUT $P_{1dB}$ | 0.7 dBm | -2.6 dBm | -2.5 dBm |
| CHIP SIZE | 1x1 mm$^2$ | | |
| POWER CONSUMPTION | 84mw | | |

CONCURRENT TRIPLE-BAND GAIN AMPLIFIER FOR MULTI-STANDARD COEXIST COMMUNICATIONS

BACKGROUND OF THE INVENTION

1. Field of the Invention

The present invention generally relates to a microwave integrated circuit (MIC), and more particularly to a triple-band gain amplifier capable of simultaneously operating in three separated frequency bands.

2. Description of the Related Art

The rapid development of the coexist operation of multi-standard wireless and mobile communication has been driving RF transceivers to have a new multi-band characteristic. Existing examples include the multimode wireless LAN IEEE802.11a/b/g card (at 2.4 GHz and 5.2 GHz), the integrated Bluetooth and wireless LAN card (at 2.4 GHz, 5.2 GHz), and the integrated GSM/WLAN handset (900 MHz, 1900 MHz, and 2.4 GHz). The new wireless standard Ultra-Wide-Band system (UWB), allocated from 3.1–10.6 GHz, is soon to be in service. This requirement has driven the conventional single-band RF circuits, such as gain amplifier (GA), bandpass filter, mixers, voltage controlled oscillators (VCOs) and power amplifier (PA), to a new design era.

To have gain at multiple frequency bands, a prioi-art design by S. Wu and B. Razavi, entitled "A 900-MHz/1.8-GHz CMOS receiver for dual-band applications," *IEEE J. Solid-State Circuits*, vol. 33, pp. 2178–2185, December 1998, was implementing two LNA circuits separately, one for the low-band (800–1000 MHz) and the other for the high-band 1800 MHz. Other design by J. Ryynanen et al, entitled "A dual-band RF front-end for WCDMA and GSM applications," *IEEE Journal of Solid-State Circuits*, vol. 36, August 2001, adopted a switched dual-band architecture, where two variable-gain LNAs at 900 MHz and 2100 MHz respectively are switched them by biasing the cascaded transistors. This approach needs more component count since one gain amplifer is unused when the other is activated.

Wideband design, such as the work by Armiji and Meyer, entitled "A new wide-band Darlington amplifier," IEEE J. Solid-State Circuits, vol. 16, p. 634, December 1981, seems to be able to use simpler circuit architecture and fewer components to achieve gain over a broad range of frequency. But it has drawback of in-band interference problem.

The third approach, proposed by H. Hashemi and A. Hajimiri, entitled "Concurrent Multiband Low-Noise Amplifiers-Theory, Design, and Applications," *IEEE Trans. Microwave Theory Tech.*, Vol. 50, No. 1, pp. 288–301, January 2002, employed dual-band match technique to achieve gain match simultaneously at two different frequency bands. This results in high reuse of passive and active components. This design is limited to dual-band applications.

According to the above problems, there is a need for a highly-reused gain-amplifier circuit, capable of achieving gain match simultaneously at three different frequency bands for the rapidly-developed multi-mode wireless communications.

SUMMARY OF THE INVENTION

It is an objective of the present invention to provide a concurrent triple-band gain amplifier with high component-reused circuitry.

It is another objective of the present invention to provide a triple-band gain amplifier which can be implemented by the hybrid or monolithic microwave integrated circuit technology.

To achieve the above objectives, the present invention provides a triple-band gain amplifier which can provide excellent performance in three frequency bands.

An illustrative embodiment of the invention is a gain amplifier capable of concurrent operation at 2.4-GHz, 5.8-GHz and 9.0-GHz bands.

The gain amplifier comprises an amplification stage for amplifying a signal applied to an input of the gain amplifier and a multi-band match network connected among the output node of the transistor, the voltage source, and the output port. The multi-band match network uses a composite combination of inductors and capacitors to provide gain match at a first frequency band, a second frequency band, and a third frequency band. The multi-band match network includes a first capacitor, a first inductor, a second capacitor, a second inductor, and a third inductor. The first capacitor and the first inductor are connected in parallel to form a shunt resonator. The second capacitor and the second inductor are connected in series to form a series resonator. The above shunt resonator and the series resonator are connected in parallel, which is then connected in series with the third inductor.

According to one aspect of the gain amplifier, the amplification stage is a Darlington amplifier implemented by using the monolithic microwave integration circuit (MMIC) technology.

According to one aspect of the gain amplifier, the multi-band match network is implemented by using monolithic microwave integration circuit (MMIC) technology except that the third inductor is off chip.

According to one aspect of the gain amplifier, the inductance of the third inductor determines the center frequency of the third pass band of gain amplifier.

According to the gain amplifier of the present invention, it can effectively provide triple-band signal amplification and spurious suppression with high reuse of on-chip elements

BRIEF DESCRIPTION OF THE DRAWINGS

All the objects, advantages, and novel features of the invention will become more apparent from the following detailed descriptions when taken in conjunction with the accompanying drawings.

DETAILED DESCRIPTION OF THE PREFERRED EMBODIMENT

Although the invention has been explained in relation to several preferred embodiments, the accompanying drawings and the following detailed descriptions are the preferred embodiment of the present invention. It is to be understood that the following disclosed descriptions will be examples of present invention, and will not limit the present invention into the drawings and the special embodiment.

The present invention will be illustrated below in conjunction with an exemplary gain amplifier for use in Bluetooth and IEEE 802.11b/g from 2400 to 2484 MHz, IEEE 802.11a from 5150 to 5825 MHz, and UWB from 3.1 to 10.6 GHz. It should be understood, however, that the invention is not limited to use with any particular amplifier type, set of frequency bands or communication system, but is instead more generally applicable to any multi-band wireless application in which it is desirable to reduce the complexity and cost of the radio frequency (RF) circuitry in a multi-band transceiver front-end. For example, the invention is suitable for use in mobile station receivers of the PCS systems described in greater detail in TIA/EIA/IS-95A, "Mobile Station—Base Station Compatibility for Dual-Mode Wideband Spread Spectrum Cellular System," June 1996, TIA/EIA/IS-97A, "Recommended Minimum Performance Standards for Base Station Supporting Dual-Mode Wideband Spread Spectrum Cellular Mobile Stations," June 1997, TIA/EIA/IS-98A, "Recommended Minimum Performance Standards for Dual-Mode Wideband Spread Spectrum Cellular Mobile Stations," June 1998, and ANSI J-STD-008, "Personal Station—Base Station Compatibility Requirements for 1.8 to 2.0 GHz Code Division Multiple Access (CDMA) Personal Communication Systems," all of which are incorporated by reference herein. The term "triple band match" as used herein refers to a match which provides a desired gain, noise figure or other performance over a single amplifier operating in three separated frequency bands, while suppressing gain between the bands.

Figure 1:
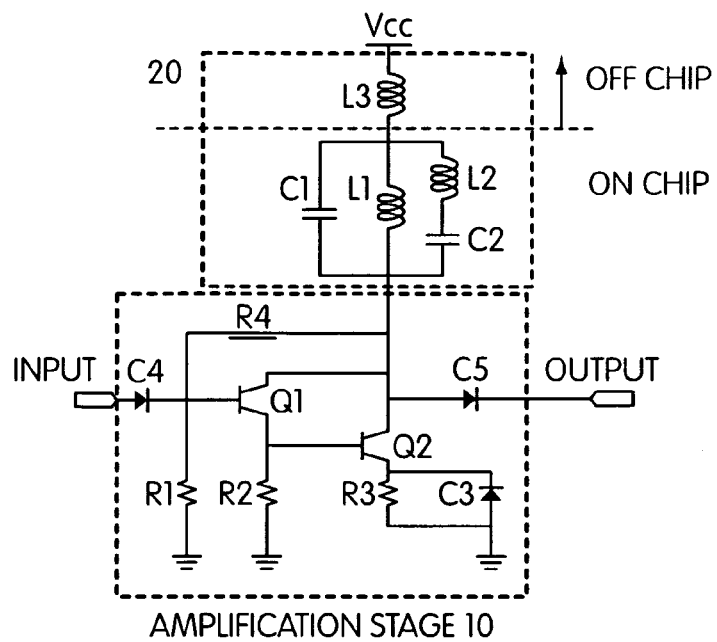
FIG. 1 shows a schematic diagram of the concurrent triple-band gain amplifier in accordance with the invention.

Referring to FIG. 1, it shows a schematic diagram of concurrent triple-band gain amplifier in accordance with the invention. A gain amplifier comprises an amplification stage 10 and a multi-band resonant load 20. The amplification stage 10 is used for amplifying a signal applied to an input of the gain amplifier; and the multi-band resonant load 20, connected between a DC bias voltage Vcc and a DC bias input of the amplification stage 10. The multi-band resonant load use a set of elements to provide a match in a first frequency band, and at least two subset of the set of elements to provide a match in a second frequency band and in a third frequency band. The set of elements includes a first capacitor C1, a first inductor L1, a second capacitor C2, a second inductor L2 and a third inductor L3. The first capacitor C1 and the first inductor L1 are connected in parallel to form a shunt resonator. The second capacitor C2 and the second inductor L2 are connected in series to form a series resonator. The above shunt resonator and the series resonator are connected in parallel, which is then connected in series with the third inductor L3.

In general, the amplification stage 10 can be a Darlington amplifier, comprising the transistors pair $Q_1$, $Q_2$, bias circuits, and feedback elements. The Darlington amplifier can be selected to have a broad bandwidth, as described in detail in K. W. Kobayashi et al, "GaAs HBT MMIC broadband amplifiers from dc to 20 GHz," in *IEEE Microwave and Millimeter-Wave Monolithic Circuits Symp. Dig.*, p. 19, 1990. In this embodiment, the transistors $Q_1$ and $Q_2$ are both 2.8×12 double-base HBT. Other suitable types of the transistors $Q_1$ and $Q_2$ include: Bipolar Junction Transistor (BJT), Heterojunction Bipolar Transistor (HBT), High Electronic Mobility Transistor (HEMT), Pseudomorphic HEMT (PHEMT), Complementary Metal Oxide Semiconductor Filed Effect Transistor (CMOS) and Laterally Diffused Metal Oxide Semiconductor Filed Effect Transistor (LD-MOS). Preferably, PHEMT is suitable for the gain stage and power stage in the microwave to millimeter wave range. Semiconductor materials broadly applicable to the gain stage and power stage include: silicon, silicon-on-insulator (SOI), silicon-germanium (SiGe), gallium arsenide (GaAs), indium phosphide (InP) and silicon-germanium-carbon (SiGe—C). Transistor $Q_1$ works as a source follower and transistor $Q_2$ acts as a degenerated common-emitter amplifier. All resistors R1, R2, R3 and R4 in the amplification stage 10 play the role of biasing the transistor Q1 and Q2. Besides, some of them have the other unique function. Resistors R1, R2 and R3 primarily determine the feedback power and decide the input and output impedance of the amplification stage 10. The resistor R4 determines the transistor's collect voltage and linearity of the amplification stage 10. Peaking capacitor C3 provides zeros in the closed loop frequency response that increases the operation bandwidth of Darlington amplification stage 10. As well known, bandwidth of Darlington amplifier can be controlled by choosing a proper degeneration resistor R2 and R3 and peaking capacitor C3. This characteristic is very useful when controlling bandwidth of the third pass band of the gain amplifier of the invention.

Figure 2A:
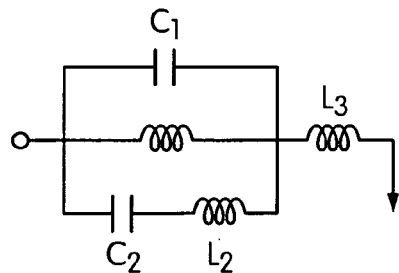
FIG. 2 shows a circuit diagram and transfer function of triple-band resonance load of the concurrent triple-band gain amplifier of FIG. 1.
Figure 2B:
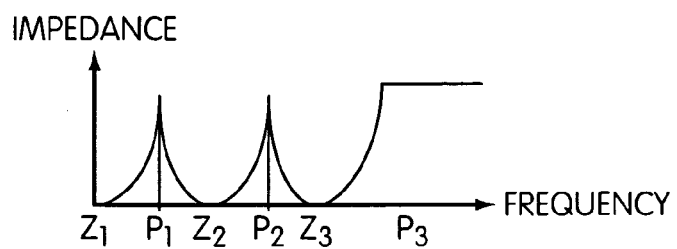

FIG. 2 shows a circuit diagram and its transfer function of triple-band resonance load 20 of the concurrent triple-band gain amplifier of FIG. 1. It has three poles at $\omega_{p1}$, $\omega_{p2}$, and $\omega_{p3}$, and it three zeros at $\omega_{z1}$, $\omega_{z2}$, and $\omega_{z3}$, which are derived as below:

$$\omega_{p1} = \left[ \frac{(L_1C_1 + L_2C_2 + L_1C_2) - \sqrt{(L_1C_1 + L_2C_2 + L_1C_2)^2 - 4L_1L_2C_1C_2}}{2L_1L_2C_1C_2} \right]^{1/2} \quad (1)$$

$$\omega_{p2} = \left[ \frac{(L_1C_1 + L_2C_2 + L_1C_2) + \sqrt{(L_1C_1 + L_2C_2 + L_1C_2)^2 - 4L_1L_2C_1C_2}}{2L_1L_2C_1C_2} \right]^{1/2} \quad (2)$$

$$\omega_{p3} = \infty \quad (3)$$

$$\omega_{z1} = 0 \quad (4)$$

$$\omega_{z2} = \left[ \frac{L_2C_2(L_1 + L_3) + L_1L_3(C_1 + C_3) - \sqrt{[L_2C_2(L_1 + L_3)]^2 + [L_1L_3(C_1 + C_3)]^2 - 2L_1L_2L_3C_2(L_1 + L_3)(C_1 - C_2)}}{2L_1L_2L_3C_1C_2} \right]^{1/2} \quad (5)$$

$$\omega_{z3} = \left[ \frac{L_2C_2(L_1 + L_3) + L_1L_3(C_1 + C_3) + \sqrt{[L_2C_2(L_1 + L_3)]^2 + [L_1L_3(C_1 + C_3)]^2 - 2L_1L_2L_3C_2(L_1 + L_3)(C_1 - C_2)}}{2L_1L_2L_3C_1C_2} \right]^{1/2} \quad (6)$$

The first pole $\omega_{p1}$ and the second pole $\omega_{p2}$ of the triple-band resonance load 20 determine the center frequencies of the first and second pass-bands. The third passband is determined by the third zero frequency and the gain roll-off of the Darlington amplification stage 10. The first zero at DC allows the DC current flows from the voltage supply Vcc to the bias input point of Darlington amplification stage 10. The second zero and the third zero frequencies enhance the in-band interference rejection. DC supply current can pass through the triple-band resonance load 20 and then bias the Darlington amplification stage 10; the resonance load 20 also plays the role of RF choke at desired bands.

It is noted the concurrent triple-band gain amplifier is preferably fabricated by using monolithic microwave integration circuit (MMIC) technology. The amplification stage 10 and the triple-band resonance load 20 are fabricated on a single chip, except the third inductor L3 can be either on chip, off chip, or realized by the bonding wire.

All simulations may be optimized in accordance with a particular set of design goals using optimization tools such as an optimization function available in software packages from the ADS simulator and Gummel-Poon (GP) models for the applied transistors. It should again be emphasized that the inductive values of the inductors and capacitive values of the capacitors are for a particular illustrative embodiment, and should not be construed as limiting the invention to any particular embodiment or class of embodiments. The values selected in a given application will depend on the particular design goals, the particular conFIGuration of the matching networks, the type of transistor used as well as other factors.

Figure 3:
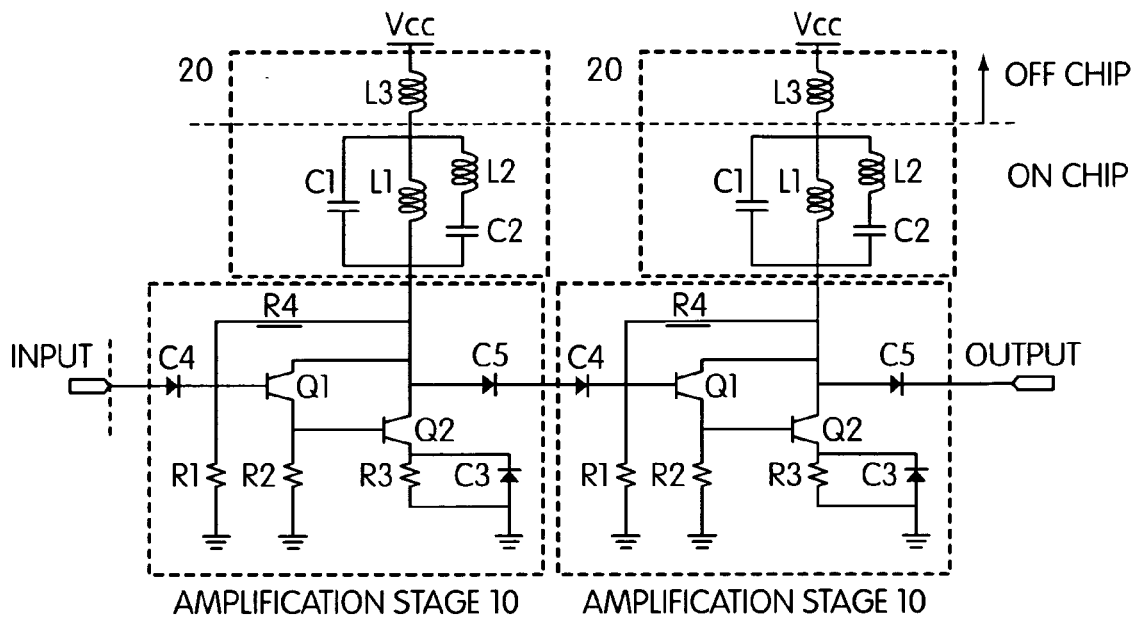
FIG. 3 shows a schematic diagram of concurrent triple-band gain amplifier with two cascaded amplification stages in accordance with the invention.
Figure 4:
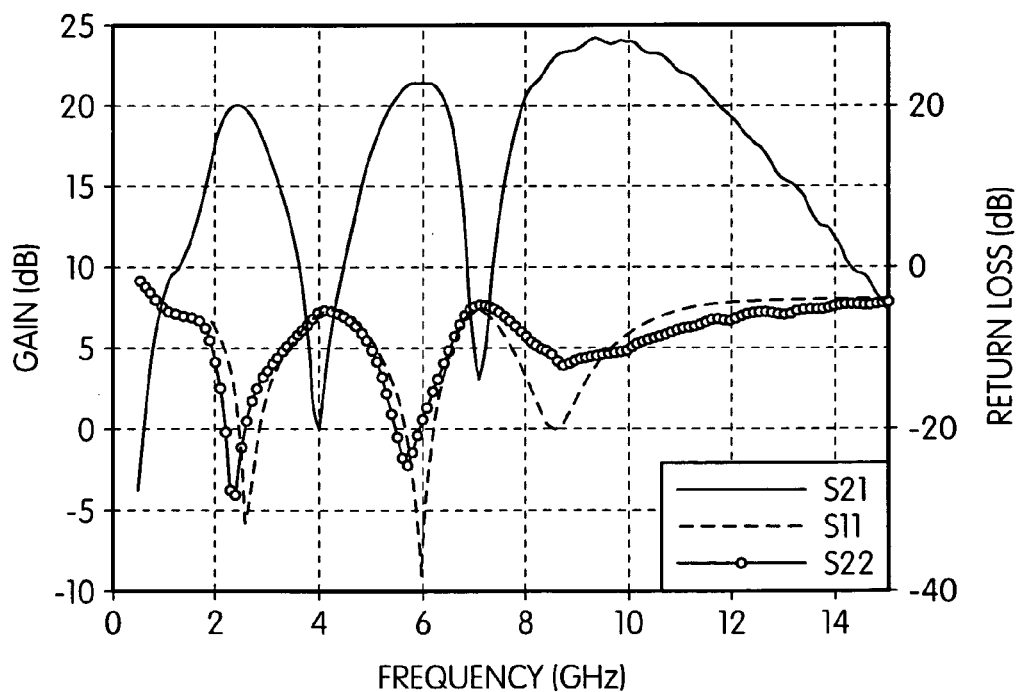
FIG. 4 shows plots of the measured S-parameter of concurrent triple-band amplifier of FIG. 3.

FIG. 3 shows a schematic diagram of concurrent triple-band gain amplifier with two cascaded amplification stages in accordance with the invention. The impedance of amplification stage 10 is near 50 ohms such that two stages of Darlington amplification stage 10 can be easily cascaded by direct-coupled capacitor, C5, showed in FIG. 3. The benefits of direct couple method include saving chip area, obtaining high gain performance and filtering low band interferences. The cascaded gain amplifier of FIG. 3 is configured in this illustrative embodiment to operate with C1=0.6 pF, C2=0.6 pF, L1=3.0 nH, L2=2.2 nH, L3=2.4 nH, DC bias voltage Vcc of 3 V, and DC current of 14 mA. These values are selected to demonstrate that the amplifier can be operated reliably in multi-frequency bands using supplies derived from a single chemical battery in a handset or other communication terminal. FIG. 4 shows plots of the measured S-parameter of concurrent triple-band amplifier of the concurrent triple-band gain amplifier of FIG. 3. The amplifier scattering parameters were measured on wafer using RF probes. Performances of cascaded amplifiers are summarized in Table 1. While drawing 14 mA from a 3 V supply voltage, the amplifier achieves triple-band gains of 20.2, 21.4 and 22.6 dB, input return losses of 16.7, 24.3 and 11.2 dB, and output return losses of 28.2, 23, and 10.3 dB at 2.4, 5.8 and 9.0 GHz, respectively. The total chip size is 1 mm×1 mm and it consumes 84 mW. It should be noted that these biasing conditions are only exemplary, and other suitable arrangements could also be used. The bias conditions selected in a given embodiment will of course depend on factors such as the frequency bands and the characteristics of the amplification stage 10.

Figures 5, 6:
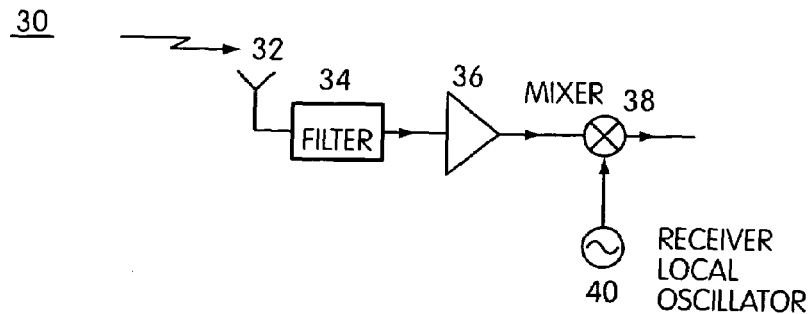
FIG. 5 shows exemplary receivers configured in accordance with the invention.
FIG. 6 shows the performance summary of the concurrent triple-band gain amplifier of FIG. 1.

FIG. 5 shows show exemplary receiver 30 configured in accordance with the invention. A receiver 30 includes an antenna 32, a filter 34, an amplifier 36, a mixer 38 and a frequency synthesizer 40. The antenna 32 can be designed as multi-band antenna or three individual antennas to receive three different RF signals. The outputs of the antennas 32 is filtered in a filter 34 and then applied to an input of an amplifier 36. The amplifier 36 may be of the type described in conjunction with FIG. 1 above, or another suitable low-noise amplifier in accordance with the invention. The filter 34 may be implemented as a variable band-pass filter which is capable of being adjusted to provide band-pass filtering of both the ISM, WLAN and UWB frequency bands, or a filter which can pass both bands simultaneously without adjustment. The output of the amplifier 36 may be applied to an optional image rejection filter (not shown) which in this example is implemented as a variable band-pass filter. The image rejection filter may be eliminated in alternative embodiments. The image rejection output of the filter is applied to a mixer 38. The mixer 38 uses an appropriate local oscillator signal supplied by a frequency synthesizer 40 to down-convert an RF signal received by antenna 32 to an intermediate frequency (IF) signal. The receiver 30 is thus able to receive an input signal in one of at least two different frequency bands, using only a single amplifier 36.

From the above description, the gain amplifier according to the present invention can obtain high gain at different frequencies. The first and the second pass bands can be applied to ISM band and WLAN services, respectively. For high data rates up to 480 Mbps, the third pass band is for Band 10–14 in UWB application [TI proposal]. In this configuration of the invention, a traditional concurrent dual-band amplifier can be extended to a triple-band application. The circuit of the present invention can be treated as a triple-band active filter that has signal amplification and image rejection ability. In addition, the circuit provides a system designer another choice, when integrating multi-standards transceiver.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A gain amplifier, comprising:
  an amplification stage for amplifying a signal applied to an input of the amplifier; and
  a multi-band resonant load connected between a DC bias voltage and a DC bias input of the amplification stage, the multi-band resonant load using a set of elements to provide a match in a first frequency band, at least two subset of the set of elements to provide a match in a second frequency band, and in a third frequency band;
  wherein the set of elements includes a first capacitor, a first inductor, a second capacitor, a second inductor and a third inductor,
  the first capacitor and the first inductor being connected in parallel to form a shunt resonator,
  the second capacitor and the second inductor being connected in series to form a series resonator, and
  the shunt resonator and the series resonator being connected in parallel, which is then connected in series with the third inductor L3.

2. A gain amplifier as claimed in claim 1, wherein the amplification stage is a Darlington amplifier.

3. A gain amplifier as claimed in claim 1, wherein the amplification stage is fabricated by using monolithic microwave integration circuit (MMIC) technology.

4. A gain amplifier as claimed in claim 3, wherein the amplification stage is fabricated by the heterojunction bipolar transistor (HBT) technology on GaAs substrate.

5. A gain amplifier as claimed in claim 1, wherein the multi-band resonant load is fabricated by using monolithic microwave integration circuit (MMIC) technology.

6. A gain amplifier as claimed in claim 1, wherein the multi-band resonant load is fabricated by using monolithic microwave integration circuit (MMIC) technology on a single chip, except the third inductor is off chip.

7. A gain amplifier as claimed in claim 6, wherein the third inductor is implemented by the bounding wire.

8. A gain amplifier as claimed in claim 1, wherein the first and the second poles of the triple-band resonance load determine the center frequencies of the first and second pass-bands.

9. A gain amplifier as claimed in claim 2, wherein the third zero frequency of the triple-band resonance load and the gain roll-off of the Darlington amplification stage the third passband.

10. A gain amplifier as claimed in claim 1, wherein the second zero and the third zero of the triple-band resonance load enhance the in-band interference rejection.

11. A gain amplifier as claimed in claim 1, wherein the first frequency band is centered at about 2.4 GHz, the second frequency band is centered at about 5.8 GHz and the third frequency band is centered at about 9.0 GHz.

12. A method of operating a gain amplifier in multiple frequency bands, the method comprising the steps of:
    amplifying a signal applied to an input of the amplifier in an amplification stage; and
    utilizing a set of elements of a triple-band resonance load connected between a DC bias voltage and a DC bias input of the amplification stage to provide match in a first frequency band, a second frequency band, and a third frequency band; the set of elements including a first capacitor, a first inductor, a second capacitor, a second inductor and a third inductor; the first capacitor and the first inductor being connected in parallel to form a shunt resonator; the second capacitor and the second inductor being connected in series to form a series resonator; and the above shunt resonator and the series resonator being connected in parallel, which is then connected in series with the third inductor.

13. A method as claimed in claim 12, wherein the amplification stage is a Darlington amplifier.

14. A method as claimed in claim 12, wherein the amplification stage is fabricated by using monolithic microwave integration circuit (MMIC) technology.

15. A method as claimed in claim 14, wherein the amplification stage is fabricated by heterojunction bipolar transistor (HBT) technology on GaAs substrate.

16. A method as claimed in claim 12, wherein the triple-band resonance load is fabricated by using monolithic microwave integration circuit (MMIC) technology.

17. A method as claimed in claim 12, wherein the triple-band resonance load is fabricated by using monolithic microwave integration circuit (MMIC) technology on a single chip, except the third inductor is off chip.

18. A method as claimed in claim 17, wherein the third inductor is implemented by the bounding wire.

19. A method as claimed in claim 12, wherein the first and the second poles of the multi-band resonant load determine center frequencies of the first and second pass band.

20. A method as claimed in claim 13, wherein the third zero frequency of the triple-band resonance load and the gain roll-off of the Darlington amplification stage the third passband.

21. A method as claimed in claim 12, wherein the second zero and the third zero of the triple-band resonance load enhance the in-band interference rejection.

22. A method as claimed in claim 12, wherein the first frequency band is centered at about 2.4 GHz, the second frequency band is centered at about 5.8 GHz and the third frequency band is centered at about 9.0 GHz.

23. A signal receiver comprising:
    at least one antenna for receiving a signal in at least one of a first frequency band and a second frequency band;
    a filter having an input coupled to an output of the at least one antenna, the filter providing filtering of the received signal in at least one of the first and second frequency bands;
    a gain amplifier having an input coupled to an output of the filter, the gain amplifier including an amplification stage for amplifying the received signal applied to an input of the amplifier, and a triple-band resonance load connected between a DC bias voltage and a DC bias input of the amplification stage, triple-band resonance load connected between a DC bias voltage and a DC bias input of the amplification stage to provide match in a first frequency band, a second frequency band, and a third frequency band; the set of elements including a first capacitor, a first inductor, a second capacitor, a second inductor and a third inductor; the first capacitor and the first inductor being connected in parallel to form a shunt resonator; the second capacitor and the second inductor being connected in series to form a series resonator; the above shunt resonator and the series resonator being connected in parallel, which is then connected in series with the third inductor; and
    a signal converter having an input coupled to an output of the amplifier, the signal converter converting the received signal to an intermediate frequency.

* * * * *